(12) United States Patent
Gupta et al.

(10) Patent No.: US 7,072,617 B1
(45) Date of Patent: Jul. 4, 2006

(54) SYSTEM AND METHOD FOR SUPPRESSION OF RFI INTERFERENCE

(75) Inventors: Bindu Gupta, North Brunswick, NJ (US); Faramarz Sabouri, Lawrenceville, NJ (US); Vladimir Friedman, Scotch Plains, NJ (US)

(73) Assignee: Analog Devices, Inc., Norwood, MA (US)

( * ) Notice: Subject to any disclaimer, the term of this patent is extended or adjusted under 35 U.S.C. 154(b) by 281 days.

(21) Appl. No.: 10/850,307

(22) Filed: May 19, 2004

(51) Int. Cl.
*H04B 1/10* (2006.01)

(52) U.S. Cl. ........................ 455/63; 330/149
(58) Field of Classification Search ............. 455/63; 330/252, 258, 69, 149
See application file for complete search history.

(56) References Cited

U.S. PATENT DOCUMENTS 5,721,756 A * 2/1998 Liebetréu et al. .......... 375/344
5,995,567 A  11/1999 Cioffi et al. .............. 375/346
6,567,479 B1 * 5/2003 Alderton ................... 375/326

* cited by examiner

*Primary Examiner*—Henry Choe
(74) *Attorney, Agent, or Firm*—Koppel, Patrick & Heybl

(57) ABSTRACT

A system and method for suppressing RFI receives a differential input signal $V_d$, and a signal $V_{cm}$ which varies with the common mode component of $V_d$. $V_{cm}$ is phase-shifted and then amplified with a programmable gain G1 to produce an output $V_{A1}$. A subtractor produces an output $V_{sub}$ which varies with $V_d - V_{A1}$. $V_{sub}$ is amplified with a programmable gain G2 to produce an output $V_{A2}$. An analog input signal processing circuit receives $V_{A2}$ at an input which has an associated maximum dynamic range. A processor adjusts G2 such that $V_{A2}$ covers the maximum dynamic range, adjusts the phase shift and G1 to minimize $V_{A2}$, and adjusts G2 to increase $V_{A2}$ such that it again covers the maximum dynamic range. The RFI in $V_d$ is substantially subtracted out, thereby enabling the full dynamic range of the analog input signal processing circuit to be employed in receiving $V_d$.

21 Claims, 2 Drawing Sheets

SYSTEM AND METHOD FOR SUPPRESSION OF RFI INTERFERENCE

BACKGROUND OF THE INVENTION

1. Field of the Invention

This invention relates to the field of radio frequency interference (RFI) suppression, and particularly to systems and methods for suppressing RFI in wired transmission systems.

2. Description of the Related Art

The performance of wired data transmission systems can be degraded by RFI which originates from local amateur radio operators. For example, a high-speed Internet access system employing VDSL modems might occupy a bandwidth of up to 12 MHz; amateur radio bands are allocated frequency bands between 1.8 MHz and 30 MHz. A signal received by the modem is typically fed to the input of an analog-to-digital converter (ADC). Due in part to poor balance of the twisted pairs making up the data transmission system, RFI from a local ham operator can be coupled into the ADC input. The RFI power may be 10–20 dB larger than the received signal power, thereby significantly degrading the dynamic range of the ADC.

Some modems employ a receive (RX) filter designed to attenuate any signals beyond 12 MHz. However, such filters are generally less than 100% effective; as such, RFI due to amateur radio frequencies between 1.8 MHz and 30 MHz can adversely affect modem performance.

SUMMARY OF THE INVENTION

A system and method for suppressing RFI is presented, which significantly reduces RFI present in a data signal applied to the analog input of a receiving system.

The present system receives a differential input signal $V_d$ at a first input, and a signal $V_{cm}$ which varies with the common mode component of $V_d$ at a second input. Signal $V_{cm}$ is compared with a predetermined threshold, and an "enable" flag is set when $V_{cm}$ is greater than the threshold—thereby indicating the presence of RFI in differential input signal $V_d$ and $V_{cm}$.

$V_{cm}$ is phase shifted by a programmable amount $\Phi_1$, and the phase-shifted output is provided to a first amplifier having a programmable gain G1 which produces an output $V_{A1}$ that varies with $V_{cm}*G1$. A subtractor circuit receives $V_d$ at a first input and $V_{A1}$ at a second input and produces an output $V_{sub}$ which varies with $V_d - V_{A1}$. A second amplifier having a programmable gain G2 receives $V_{sub}$ at an input and produces an output $V_{A2}$ which varies with $V_{sub}*G2$.

An analog input signal processing circuit, typically an analog-to-digital converter (ADC), receives $V_{A2}$ at an input which has an associated maximum dynamic range. A processor, typically a digital signal processor (DSP), receives the enable flag and a signal which varies with $V_{A2}$—such as the output of an ADC—at respective inputs. The processor is arranged to:

adjust programmable gain G2 such that $V_{A2}$ covers the analog input signal processing circuit's maximum dynamic range;

adjust, if the enable flag is set, programmable phase $\Phi_1$ and programmable gain G1 to minimize $V_{A2}$;

adjust, after $V_{A2}$ is minimized, programmable gain G2 to increase $V_{A2}$ such that it again covers the maximum dynamic range.

When so arranged, most or all of the RFI present in input signal $V_d$ is subtracted out, thereby enabling the full dynamic range of the analog input signal processing circuit to be employed in receiving $V_{A2}$.

Further features and advantages of the invention will be apparent to those skilled in the art from the following detailed description, taken together with the accompanying drawings.

DETAILED DESCRIPTION OF THE INVENTION

The present system reduces undesirable RFI present in a data signal received by, for example, a VDSL modem. The RFI typically originates with local amateur radio operators, which operates on frequency bands from 1.8 MHz to 30 MHz, though the invention is applicable to RFI in any frequency band. Reduction or cancellation of undesirable RFI is needed to ensure that the full dynamic range of the analog receiving circuitry is available to the incoming data signal.

Figure 1:
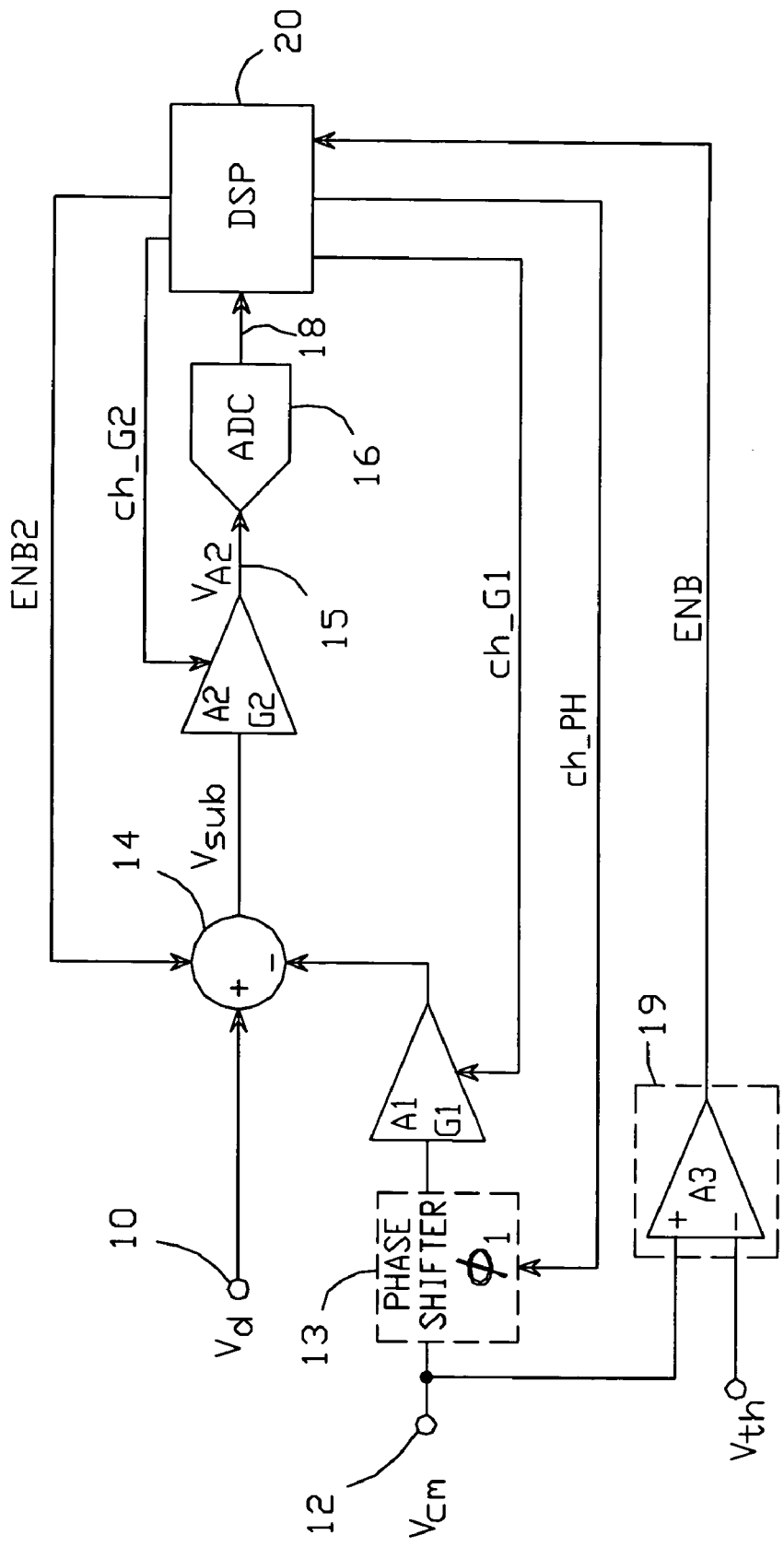
FIG. 1 is a block diagram illustrating the basic principles of the present RFI suppression system.

A diagram illustrating the principles of the present system is shown in FIG. 1. A differential input signal $V_d$ is received at an input 10. A signal $V_{cm}$ which varies with the common mode component of differential input signal $V_d$ is received at an input 12. In a typical application such as a VDSL modem, a transmitted differential input signal is normally coupled to the modem through a hybrid circuit which includes a transformer. $V_{cm}$ could be obtained from a center tap on the primary side of the transformer, with $V_d$ being the differential signal across the secondary side. Undesirable RFI may be coupled into $V_d$ and $V_{cm}$.

When RFI is present—

$V_d$ is given by:

$$V_d = V_{dmt} + V_{rfid} + V_{n1},$$

where $V_{dmt}$ is the desired differential input signal, $V_{rfid}$ is the differential component of the RFI present in $V_d$, and $V_{n1}$ is an uncorrelated noise signal.

$V_{cm}$ is given by:

$$V_{cm} = V_{dmtc} + V_{rfic} + V_{n2},$$

where $V_{dmtc}$ is the common mode part of the desired input signal, $V_{rfic}$ is the common mode part of the RFI signal, and $V_{n2}$ is an uncorrelated noise signal.

The differential and common mode components of the RFI signal can be approximated by:

$$V_{rfid} = V_{da} \cdot \cos(\omega t + \Phi_d) \text{ and } V_c = V_c \cdot \cos(\omega t + \Phi_c),$$

where $V_{da}$ and $V_c$ are the amplitudes of the differential and common mode components of the RFI present in $V_d$ and $V_{cm}$, respectively, $\omega$ is the frequency of the RFI signal, and $\Phi_d$ and $\Phi_c$ are the phase differences between $V_{rfid}$ and $V_{rfic}$, respectively, and the RFI signal. Then, $$V_c = \frac{5.48\sqrt{P_t}}{d} \text{ and } V_{da} = \frac{5.48\sqrt{P_t}}{d \cdot b}$$

where $P_t$ is the RF power transmitted, d is the distance of the modem input cable from the amateur radio transmitter, and b is the "balance" of the cable. "Balance" of the cable is a function of frequency, and reduces at higher frequencies. As a typical example, $P_t$ might be 400 W, d might be 10 m, and b might be 30 db. Then, $V_{rfid}$ will be about 11 volts, and $V_{rfic}$ will be about 360 mv. Therefore, in the presence of RFI, $V_{rfid}$ and $V_{rfic}$ will be much larger than the desired signal (typically around 60–80 mv for a cable length of 1.5 km). As such, small noise sources $V_{dmtc}$, $V_{n1}$ and $V_{n2}$ can be neglected.

Signal $V_{cm}$ is preferably fed to a programmable phase shifter circuit 13 which introduces a phase shift of $\Phi_1$ into $V_{cm}$. $\Phi_1$ is preferably varied by means of a control signal ch_PH provided to phase shifter 13; circuit 13 is arranged to vary $\Phi_1$ when ch_PH is set, and to hold $\Phi_1$ at its current setting when ch_PH is reset. The phase-shifted output of phase shifter 13 is connected to an amplifier A1 having a programmable gain G1 which produces an output $V_{A1}$ that varies with $V_{cm}*G1$. Gain G1 is preferably varied by means of a control signal ch_G1 provided to A1; A1 is arranged to vary G1 when ch_G1 is set, and to hold G1 at its current setting when ch_G1 is reset. Differential input signal $V_d$ is connected to a first input of a subtractor circuit 14, and $V_{A1}$ is connected to the subtractor's second input, such that the subtractor produces an output $V_{sub}$ which varies with $V_d - V_{A1}$. Signal $V_{sub}$ is connected to an amplifier A2 having a programmable gain G2, which produces an output VA2 that varies with $V_{sub}*G2$. Gain G2 is preferably varied by means of a control signal ch_G2 provided to A2; A2 is arranged to vary G2 when ch_G2 is set, and to hold G2 at its current setting when ch_G2 is reset. In the examples herein, the control signals are "set" when they are at a logic "1", and are "reset" when they are at a logic "0"; of course, this might be reversed in some applications.

Signal $V_{A2}$ is provided to the input 15 of an analog input signal processing circuit 16 which has an associated maximum dynamic range. When RFI is present in signal $V_{A2}$, it takes up some of this dynamic range, and thereby reduces the dynamic range available for the desired input signal. It is this dynamic range that the invention is designed to take full advantage of, by reducing the RFI present in $V_{A2}$.

When arranged as shown (and with $V_{dmtc}$, $V_{n1}$ and $V_{n2}$ neglected), signal $V_{A2}$ is given by:

$$V_{A2} = G2(V_{dmt} + V_{da}\cos(\omega t + \Phi_d) - (G1(V_c \cdot \cos(\omega t + \Phi_c + \Phi_1)))$$

The RMS value of signal $V_{A2}$ for a given $V_{dmt}$ signal will be a minimum when the differential and common mode components of the RFI are cancelled. To achieve this, the phase $\Phi_1$ and the gain Gi need to be adjusted such that $\Phi_c + \Phi_1 = \Phi_d$ and $$G1 = \frac{V_{da}}{V_c};$$

the RMS value of signal $V_{A2}$ will be higher for all other values of $\Phi_1$ and G1. The present invention controls the phase $\Phi_1$ and the gain G1 of amplifier A1 to minimize the RMS value of signal $V_{A2}$. If RFI is present, there will be a common mode RFI component present in $V_{cm}$, and a differential component present in $V_d$. The common mode and differential RFI components present in $V_{cm}$ and $V_d$ are highly correlated. Thus, gain applied to $V_{cm}$ (G1) is adjusted so that the magnitudes of the common mode and differential RFI components match, so that when the gain-adjusted common mode component is subtracted from the differential component, the RFI in the resulting signal is substantially reduced or eliminated.

If there is RFI present, then the common mode component $V_{dmtc}$ of the desired signal will be attenuated by the gain G1 of PGA1, and there will be limited degradation of desired signal $V_{dmt}$. This is because, after attenuation, the common mode component $V_{dmtc}$ will be much smaller than $V_{dmt}$, and thus the subtraction will have a very limited effect on $V_{dmt}$.

The invention preferably provides a means of disabling the RFI cancellation scheme when the RFI present is less than a predetermined threshold, so that the scheme does not add noise to the signal path or reduce the magnitude of desired signal $V_{dmt}$. This is accomplished by comparing $V_{cm}$ with a threshold voltage ($V_{th}$) selected to indicate the presence of RFI, using a comparison circuit 19 such as a comparator A3 (as shown in FIG. 1), for example. When $V_{cm} > V_{th}$, an "enable flag" ENB is set—indicating the presence of RFI; conversely, when $V_{cm} < V_{th}$, ENB is reset (i.e., set to a logic "0" in the examples herein).

The invention includes a processor 20, typically a DSP, which receives ENB and outputs control signals ch_G2, ch_G1 and ch_PH. When ENB is reset, processor 20 disables the RFI cancellation scheme. Disabling the cancellation scheme comprises resetting control signals ch_G1 and ch_PH so that G1 and $\Phi_1$ become fixed. Disabling the cancellation scheme preferably also comprises disabling subtractor circuit 14, such that $V_{sub} = V_d - V_{A1}$ when ENB is set, and $V_{sub} = V_d$ when ENB is not set; this might be accomplished with a control signal ENB2 generated by the DSP, which tracks the state of ENB.

The system operates as follows. An RMS voltage value $V_{RMS(max)}$ corresponding to the full dynamic range of the input 15 of analog input signal processing circuit 16 is ascertained. Circuit 16 typically produces an output 18 which varies with the voltage applied to its input. The RMS voltage $V_{A2(RMS)}$ of signal $V_{A2}$ applied to input 15 is compared with $V_{RMS(max)}$; this is preferably accomplished by processor 20, which receives the output 18 of analog input signal processing circuit 16 and compares it with a stored value representing $V_{RMS(max)}$. When $V_{A2(RMS)} = V_{RMS(max)}$, no action is necessary. However, if $V_{A2(RMS)} \neq V_{RMS(max)}$, processor 20 sets control signal ch_G2, causing the gain G2 of amplifier A2 to vary. G2 is varied until $V_{A2(RMS)} = V_{RMS(max)}$, at which point ch_G2 is reset, thereby locking in G2.

Now, if enable flag ENB is set, processor 20 sets control signal ch_PH, causing the phase shift $\Phi_1$ introduced by programmable phase shifter 13 to vary. $\Phi_1$ is varied until a minimum value for $V_{A2(RMS)}$ is achieved, at which point ch_PH is reset. Control signal ch_G1 is then set, causing the gain G1 of amplifier A1 to vary. G1 is varied until a minimum value for $V_{A2(RMS)}$ is achieved, at which point ch_G1 is reset. $\Phi_1$ and G1 are varied iteratively until the lowest possible minimum value for $V_{A2(RMS)}$ is achieved, at which point G1 and $\Phi_1$ are locked in. Because only $\Phi_1$ and G1 are being adjusted, any reduction in $V_{A2(RMS)}$ as $\Phi_1$ and G1 are varied is largely due to RFI being subtracted from $V_d$ by subtractor 14.

Then, processor 20 again sets control signal ch_G2, causing the gain G2 of amplifier A2 to vary until $V_{A2(RMS)} = V_{RMS(max)}$, at which point ch_G2 is reset. By so doing, most or all of the RFI present in input signal $V_d$ is subtracted from $V_d$ by subtractor circuit 14.

Comparison circuit 19 might alternatively be implemented with a one-bit or a multiple-bit ADC, with $V_{th}$ connected to the ADC's reference voltage input and $V_{cm}$ connected to its analog input. In some applications, it might be desirable for the system to have a variable threshold voltage $V_{th}$. This could be accommodated by using a multiple-bit ADC that receives a fixed threshold voltage Vth, with processor 20 arranged to interpret the ADC's digital output based on the desired threshold voltage. If using a one-bit ADC, $V_{th}$ itself would have to vary.

Figure 2:
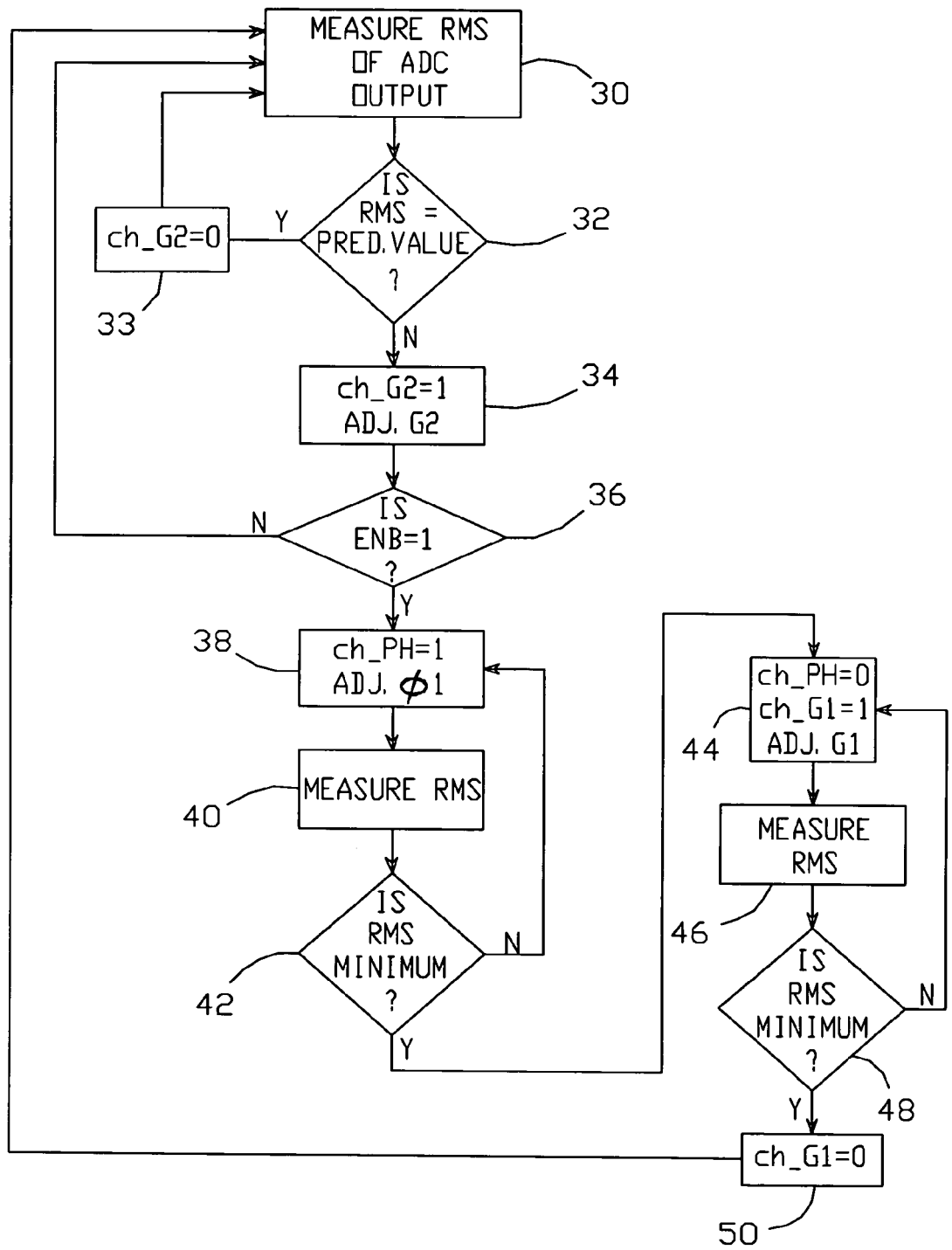
FIG. 2 is a flow chart illustrating one possible sequence of steps with which the present RFI suppression method might be practiced.

A preferred method of reducing RFI in accordance with the present invention is illustrated in FIG. 2; the steps shown in the flow chart would be employed with a system configuration similar to that shown in FIG. 1. In step 30, the RMS value of the signal applied to the analog input signal processing circuit is measured; in the preferred embodiment, the analog input signal processing circuit is an ADC, and a DSP monitors the ADC's digital output (which varies with the ADC's analog input) to determine the RMS value of the ADC's input signal. A DSP typically employs an algorithm to perform the measurement, which determines the RMS value for a "frame" having a defined duration.

Next, in step 32, the measured RMS value is compared with a predetermined value. If the RMS value is equal to the predetermined value—indicating that the applied signal covers the analog input's associated dynamic range—nothing needs to be done, and no changes are made. The gain of amplifier A2 is held constant by keeping ch_G2=0 (step 33), and the RMS value of the applied signal continues to be measured (step 30).

If the measured RMS value of the applied signal is not equal to the predetermined value, the applied signal is amplified with the gain required to make the applied signal equal to the RMS value (step 34). With respect to the system shown in FIG. 1, this is accomplished by setting control signal ch_G2 such that the gain G2 of amplifier A2 is varied until the RMS value of the applied signal is equal to the predetermined RMS value. If there is no RFI present in the applied signal, adjusting G2 just scales the signal based on its "PAR" (peak-to-average ratio) value. If RFI is present in the applied signal, adjusting G2 results in the RMS value of the desired signal being less than the predetermined value, though this is corrected in the subsequent steps.

As noted above, an enable flag ENB is set when $V_{cm}$ is greater than a threshold value $V_{th}$, indicating the presence of RFI. In step 36, the state of the enable flag is determined, typically by the processor. If the flag is reset, indicating that $V_{cm} < V_{th}$, then control reverts to step 30. If ENB is set, $V_{cm}$ is phase-shifted by a $\Phi_1$ that is adjusted until the RMS value of $V_{A2}$ is at a minimum (step 38). With respect to the system shown in FIG. 1, this is accomplished by setting control signal ch_PH such that programmable phase shifter 13 varies $\Phi_1$ until $V_{A2}$ is minimized. This will be an iterative process, with $\Phi_1$ adjusted and RMS value $V_{A2}$ measured (step 40) (preferably by monitoring the digital output of ADC 16) until the minimum RMS value is achieved (step 42). When the minimum RMS value is achieved, control signal ch_PH is reset.

Then, the phase-shifted $V_{cm}$ is amplified with a gain G1 that is adjusted until the RMS value of $V_{A2}$ is at a minimum (step 44). With respect to the system shown in FIG. 1, this is accomplished by setting control signal ch_G1 such that the gain of amplifier A1 is varied until $V_{A2}$ is minimized. This will be an iterative process, with gain G1 adjusted and RMS value $V_{A2}$ measured (step 46) (preferably by monitoring the digital output of ADC 16) until the minimum RMS value is achieved (step 48), at which point control signal ch_G1 is reset (step 50)—thereby locking in gain G1. Steps 38, 40, 42, 44, 46, 48 and 50 may be repeated until the values of G1 and $\Phi_1$ which provide the lowest possible RMS value are identified. By achieving the minimum RMS value by adjusting $\Phi_1$ and the gain of A1—which affects only $V_{cm}$ and not $V_d$—the RFI component of $V_{A2}$ is significantly reduced, leaving only the desired signal.

Note that it is not essential that the present system and method include the ability to phase-shift $V_{cm}$. If $\Phi_d$ and $\Phi_c$ are small or equal, little to no phase-shifting is required to substantially cancel the RFI. However, in most cases superior RFI cancellation will be achieved when a phase-shifting capability is included. The method illustrated in FIG. 2 is merely a preferred method; many other process sequences could be employed to implement the invention. It is only essential that the common mode component of the differential input signal be amplified and subtracted from the differential input signal so as to minimize the resulting difference signal, and then increasing the gain applied to the resulting difference signal to cover the dynamic range of the receiver's analog input.

While particular embodiments of the invention have been shown and described, numerous variations and alternate embodiments will occur to those skilled in the art. Accordingly, it is intended that the invention be limited only in terms of the appended claims.

We claim:

1. A radio frequency interference (RFI) suppression system, comprising:
   a first input for receiving a differential input signal $V_d$;
   a second input for receiving a signal $V_{cm}$ which varies with the common mode component of said differential input signal;
   a first amplifier PGA1 having a programmable gain G1 which varies in response to a first control signal and which receives $V_{cm}$ at an input and produces an output $V_{A1}$ which varies with $V_{cm}*G1$;
   a subtractor circuit which receives $V_d$ at a first input and $V_{A1}$ at a second input and produces an output $V_{sub}$ which varies with $V_d-V_{A1}$;
   a second amplifier PGA2 having a programmable gain G2 which varies in response to a second control signal and which receives $V_{sub}$ at an input and produces an output $V_{A2}$ which varies with $V_{sub}*G2$; and
   a processor which receives a signal that varies with $V_{A2}$ at an input and is arranged to:
      provide said second control signal to adjust programmable gain G2 such that $V_{A2}$ equals a predetermined value;
      provide said first control signal to adjust programmable gain G1 to minimize $V_{A2}$; and
      provide, after $V_{A2}$ is minimized, said second control signal to adjust programmable gain G2 to increase $V_{A2}$ such that it equals said predetermined value.

2. The RFI suppression system of claim 1, further comprising a programmable phase-shifting circuit interposed between $V_{cm}$ and the input of amplifier PGA1 which phase shifts $V_{cm}$ by an amount $\Phi_1$ in response to a third control signal, said processor further arranged to provide said third control signal to adjust programmable phase shift $\Phi_1$ to minimize $V_{A2}$.

3. A radio frequency interference (RFI) suppression system, comprising:
- a first input for receiving a differential input signal $V_d$;
- a second input for receiving a signal $V_{cm}$ which varies with the common mode component of said differential input signal;
- a programmable phase shifter circuit which receives $V_{cm}$ at an input, introduces a phase shift $\Phi_1$ in response to a first control signal, and produces a version of $V_{cm}$ phase-shifted by $\Phi_1$ at its output;
- a comparison circuit which sets an enable flag when $V_{cm}$ is greater than a predetermined threshold $V_{th}$;
- a first amplifier PGA1 having a programmable gain G1 which varies in response to a second control signal and which receives said phase-shifted version of $V_{cm}$ at an input and produces an output $V_{A1}$ which varies with $V_{cm}*G1$;
- a subtractor circuit which receives $V_d$ at a first input and $V_{A1}$ at a second input and produces an output $V_{sub}$ which varies with $V_d - V_{A1}$;
- a second amplifier PGA2 having a programmable gain G2 which varies in response to a third control signal and which receives $V_{sub}$ at an input and produces an output $V_{A2}$ which varies with $V_{sub}*G2$;
- an analog input signal processing circuit which receives $V_{A2}$ at an input which has an associated maximum dynamic range; and
- a processor which receives a signal which varies with $V_{A2}$ at an input and is arranged to:
  - provide said third control signal to adjust programmable gain G2 such that $V_{A2}$ covers said maximum dynamic range;
  - provide, if said enable flag is set, said first control signal to adjust programmable phase shift $\Phi_1$ to minimize $V_{A2}$;
  - provide, if said enable flag is set, said second control signal to adjust programmable gain G1 to minimize $V_{A2}$; and
  - provide, after $V_{A2}$ is minimized, said third control signal to adjust programmable gain G2 to increase $V_{A2}$ such that it covers said maximum dynamic range.

4. The RFI suppression system of claim 3, wherein said analog input signal processing circuit is an analog-to-digital converter (ADC) which receives $V_{A2}$ at its analog input and produces a digital word at its digital output which represents $V_{A2}$, said digital word being said signal which varies with $V_{A2}$.

5. The RFI suppression system of claim 4, wherein said processor is a digital signal processor (DSP) which receives said digital word and said enable flag at respective inputs and which produces said first, second and third control signals at respective outputs.

6. The RFI suppression system of claim 3, wherein said associated maximum dynamic range corresponds to a predetermined RMS voltage, said processor arranged such that:
- programmable gain G2 is adjusted to make $V_{A2}$ equal to said predetermined RMS voltage;
- programmable phase shift $\Phi_1$, if said enable flag is set, is adjusted to minimize the RMS voltage of $V_{A2}$;
- programmable gain G1, if said enable flag is set, is adjusted to minimize the RMS voltage of $V_{A2}$; and
- programmable gain G2, after the RMS voltage of $V_{A2}$ is minimized, is adjusted to make $V_{A2}$ equal to said predetermined RMS voltage.

7. The RFI suppression system of claim 6, wherein said system is subjected to RFI, said system arranged such that $V_{A2}$ is approximately given by:

$$V_{A2} = G2(V_{dmt} + V_{da} \cdot \cos(\omega t + \Phi_d) - (G1(V_c \cdot \cos(\omega t + \Phi_c + \Phi_1)))$$

where $V_{dmt}$ is the desired differential input signal, $V_{da}$ and $V_c$ are the amplitudes of the differential and common mode components of the RFI present in $V_d$ and $V_{cm}$, respectively, $\omega$ is the frequency of the RFI signal, and $\Phi_d$ and $\Phi_c$ are the phase differences between $V_{rfid}$ and $V_{rfic}$, respectively, and the RFI signal, where $V_{rfid}$ is the differential component of the RFI present in $V_d$, and $V_{rfic}$ is the common mode component of the RFI present in $V_{cm}$, such that the RMS value of signal $V_{A2}$ for a given $V_{dmt}$ signal is a minimum when $\Phi_c + \Phi_1 = \Phi_d$ and $$G1 = \frac{V_{da}}{V_c}.$$

8. The RFI suppression system of claim 3, wherein said subtractor circuit includes an enable input which is coupled to said enable flag, said subtractor circuit arranged such that $V_{sub} = V_d - V_{A1}$ when said enable flag is set and $V_{sub} = V_d$ when said enable flag is not set.

9. The RFI suppression system of claim 3, wherein said predetermined threshold is selected to indicate the presence of RFI in said differential input signal $V_d$.

10. The RFI suppression system of claim 3, wherein said comparison circuit is a comparator which receives $V_{th}$ and $V_{cm}$ at respective inputs.

11. The RFI suppression system of claim 3, wherein said comparison circuit is an analog-to-digital converter (ADC) which receives $V_{th}$ at its reference voltage input and $V_{cm}$ at its analog input.

12. The RFI suppression system of claim 11, wherein said ADC is a multiple-bit ADC, said processor arranged to interpret said ADC's digital output based on a desired $V_{cm}$ value.

13. A radio frequency interference (RFI) suppression system, comprising:
- a first input for receiving a differential input signal $V_d$ which is approximately given by:
  $V_d = V_{dmt} + V_{rfid}$, where $V_{dmt}$ is the desired differential input signal and $V_{rfid}$ is the differential component of the RFI present in $V_d$ when said system is subjected to RFI; and
- a second input for receiving a signal $V_{cm}$ which varies with the common mode component of said differential input signal which is approximately given by:
  $V_{cm} = V_{rfic}$, where $V_{rfic}$ is the common mode component of the RFI present in $V_{cm}$;
- a programmable phase shifter circuit which receives $V_{cm}$ at an input, introduces a phase shift $\Phi_1$ in response to a first control signal, and produces a version of $V_{cm}$ phase-shifted by $\Phi_1$ at its output;
- a comparison circuit which sets an enable flag when $V_{cm}$ is greater than a predetermined threshold;
- a first amplifier PGA1 having a programmable gain G1 which varies in response to a second control signal and which receives said phase-shifted version of $V_{cm}$ at an input and produces an output $V_{A1}$ which varies with $V_{cm}*G1$;
- a subtractor circuit which receives $V_d$ at a first input and $V_{A1}$ at a second input and produces an output $V_{sub}$, said subtractor circuit including an enable input which is coupled to said enable flag, said subtractor circuit arranged such that $V_{sub} = V_d - V_{A1}$ when said enable flag is set and $V_{sub} = V_d$ when said enable flag is not set;
- a second amplifier PGA2 having a programmable gain G2 which varies in response to a third control signal and which receives $V_{sub}$ at an input and produces an output $V_{A2}$ which varies with $V_{sub}*G2$, said system arranged such that $V_{A2}$ is approximately given by:

$$V_{A2}=G2(V_{dmt}+V_{da}\cdot\cos(\omega t+\Phi_d)-(G1(V_c\cdot\cos(\omega t+\Phi_c+\Phi_1))) $$

where $V_{da}$ and $V_c$ are the amplitudes of the differential and common mode components of the RFI present in $V_d$ and $V_{cm}$, respectively, $\omega$ is the frequency of the RFI signal, and $\Phi_d$ and $\Phi_c$ are the phase differences between $V_{rfid}$ and $V_{rfic}$, respectively, and the RFI signal;

such that the RMS value of signal $V_{A2}$ for a given $V_{dmt}$ signal is a minimum when $\Phi_c+\Phi_1=\Phi_d$ and $$G1 = \frac{V_{da}}{V_c};$$

an analog-to-digital converter (ADC) which has an associated maximum dynamic range which corresponds to a predetermined RMS voltage and which receives $V_{A2}$ at its analog input and produces a digital word at its digital output which represents $V_{A2}$; and a digital signal processor (DSP) which receives said digital word and said enable flag at respective inputs and is arranged to:
provide said third control signal to adjust programmable gain G2 to make $V_{A2}$ equal to said predetermined RMS voltage;
provide, if said enable flag is set, said first control signal to adjust programmable phase shift $\Phi_1$ to minimize the RMS voltage of $V_{A2}$;
provide, if said enable flag is set, said second control signal to adjust programmable gain G1 to minimize the RMS voltage of $V_{A2}$; and
provide, after the RMS voltage of $V_{A2}$ is minimized, said third control signal to adjust programmable gain G2 to make $V_{A2}$ equal to said predetermined RMS voltage.

14. The RFI suppression system of claim 13, wherein said predetermined threshold is selected to indicate the presence of RFI in said differential input signal $V_d$.

15. A method of suppressing radio frequency interference (RFI), comprising:
receiving a differential input signal $V_d$;
receiving a signal $V_{cm}$ which varies with the common mode component of said differential input signal;
amplifying $V_{cm}$ with a programmable gain G1 to produce an output $V_{A1}$ which varies with $V_{cm}*G1$;
subtracting $V_{A1}$ from $V_d$ to produce an output $V_{sub}$;
amplifying $V_{sub}$ with a programmable gain G2 to produce an output $V_{A2}$ which varies with $V_{sub}*G2$;
adjusting programmable gain G2 such that said $V_{A2}$ equals a predetermined threshold;
adjusting programmable gain G1 to minimize $V_{A2}$; and
adjusting programmable gain G2 to increase $V_{A2}$ such that it covers said maximum dynamic range.

16. The method of claim 15, further comprising phase-shifting signal $V_{cm}$ by an amount $\Phi_1$ prior to amplifying it with programmable gain G1, and adjusting $\Phi_1$ to minimize $V_{A2}$.

17. A method of suppressing radio frequency interference (RFI), comprising:
receiving a differential input signal $V_d$;
receiving a signal $V_{cm}$ which varies with the common mode component of said differential input signal;
comparing $V_{cm}$ with a predetermined threshold and setting an enable flag when $V_{cm}$ is greater than said predetermined threshold;
phase-shifting signal $V_{cm}$ by a programmable phase shift amount $\Phi_1$;
amplifying said phase-shifted signal $V_{cm}$ with a programmable gain G1 to produce an output $V_{A1}$ which varies with $V_{cm}*G1$;
subtracting $V_{A1}$ from $V_d$ to produce an output $V_{sub}$;
amplifying $V_{sub}$ with a programmable gain G2 to produce an output $V_{A2}$ which varies with $V_{sub}*G2$;
receiving $V_{A2}$ at an input which has an associated maximum dynamic range;
adjusting programmable gain G2 such that said $V_{A2}$ covers said maximum dynamic range;
adjusting, if said enable flag is set, programmable phase shift amount $\Phi_1$ to minimize $V_{A2}$;
adjusting, if said enable flag is set, programmable gain G1 to minimize $V_{A2}$; and
adjusting, after $V_{A2}$ is minimized, programmable gain G2 to increase $V_{A2}$ such that it covers said maximum dynamic range.

18. The method of claim 17, wherein said associated maximum dynamic range corresponds to a predetermined RMS voltage;
said programmable gain G2 adjusted to make $V_{A2}$ equal to said predetermined RMS voltage;
said programmable phase shift amount $\Phi_1$, if said enable flag is set, adjusted to minimize the RMS voltage of $V_{A2}$;
said programmable gain G1, if said enable flag is set, adjusted to minimize the RMS voltage of $V_{A2}$; and
said programmable gain G2, after the RMS voltage of $V_{A2}$ is minimized, adjusted to make $V_{A2}$ equal to said predetermined RMS voltage.

19. The method of claim 17, wherein said differential input signal $V_d$ is subjected to RFI, said method arranged such that $V_{A2}$ is approximately given by:

$$V_{A2}=G2(V_{dmt}+V_{da}\cdot\cos(\omega t+\Phi_d)-(G1(V_c\cdot\cos(\omega t+\Phi_c+\Phi_1)))$$

where $V_{dmt}$ is the desired differential input signal, $V_{da}$ and $V_c$ are the amplitudes of the differential and common mode components of the RFI present in $V_d$ and $V_{cm}$, respectively, $\omega$ is the frequency of the RFI signal, and $\Phi_d$ and $\Phi_c$ are the phase differences between $V_{rfid}$ and $V_{rfic}$, respectively, and the RFI signal, where $V_{rfid}$ is the differential component of the RFI present in $V_d$, and $V_{rfic}$ is the common mode component of the RFI present in $V_{cm}$, such that the RMS value of signal $V_{A2}$ for a given $V_{dmt}$ signal is a minimum when $\Phi_c+\Phi_1=\Phi_d$ and $$G1 = \frac{V_{da}}{V_c}.$$

20. The method of claim 17, wherein said subtracting is only performed when said enable flag is set, such that $V_{sub}=V_d-V_{A1}$ when said enable flag is set and $V_{sub}=V_d$ when said enable flag is not set.

21. The method of claim 17, wherein said predetermined threshold is selected to indicate the presence of RFI in said differential input signal $V_d$.

* * * * *